United States Patent
Ogino

(10) Patent No.: US 6,774,630 B2
(45) Date of Patent: Aug. 10, 2004

(54) MRI APPARATUS

(75) Inventor: Tetsuo Ogino, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/679,918

(22) Filed: Oct. 6, 2003

(65) Prior Publication Data

US 2004/0070395 A1 Apr. 15, 2004

(30) Foreign Application Priority Data

Oct. 10, 2002 (JP) ........................................ 2002-297076

(51) Int. Cl.$^7$ ................................................ G01V 3/00
(52) U.S. Cl. ........................................ 324/312; 324/306
(58) Field of Search ................................ 324/312, 314, 324/306, 307, 309, 300

(56) References Cited

U.S. PATENT DOCUMENTS

| 5,309,099 A | 5/1994 | Irarrazabal et al. |
|---|---|---|
| 5,329,231 A | 7/1994 | Hatta et al. |
| 5,899,858 A * | 5/1999 | Muthupillai et al. ........ 600/410 |
| 6,320,383 B1 | 11/2001 | Kato et al. |
| 6,479,995 B1 | 11/2002 | Ogino |
| 6,603,311 B2 | 8/2003 | Ogino |
| 6,686,739 B2 * | 2/2004 | Heid .......................... 324/312 |

* cited by examiner

Primary Examiner—Louis Arana
(74) Attorney, Agent, or Firm—Carl B. Horton, Esq.; Armstrong Teasdale LLP

(57) ABSTRACT

For the purpose of improve rendering capability for a blood vessel, an MR. image producing method comprises: window-processing MR signals using a window function f(k) that has a "value less than one" at a center (O) and in its proximate region in a k-space and on a periphery and in its proximate region in the k-space, and has a value larger than the "value less than one" between the regions in which the window function has the "value less than one;" and applying Fourier-transformation processing to the window-processed MR signals to obtain an MR image.

10 Claims, 6 Drawing Sheets

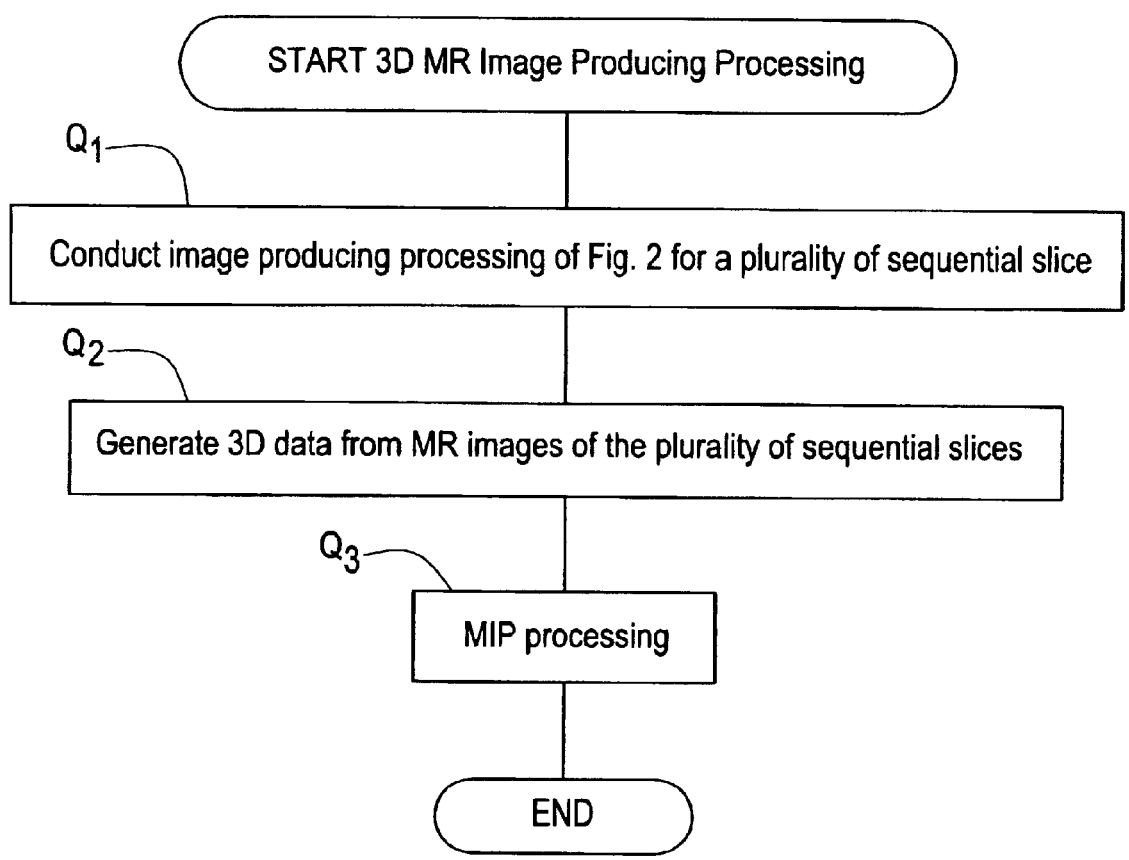

MRI APPARATUS

CROSS REFERENCE TO RELATED APPLICATIONS

This application claims the benefit of Japanese Application No. 2002-297076 filed Oct. 10, 2002.

BACKGROUND OF THE INVENTION

The present invention relates to an MR (magnetic resonance) image producing method and an MRI (magnetic resonance imaging) apparatus, and more particularly to an MR image producing method and MRI apparatus that improve on rendering capability for a blood vessel.

A conventional MRI apparatus comprises MR signal acquiring means for acquiring MR signals, window-processing means for window-processing the MR signals using a window function that has a value of "one" from the center of a k-space to a position near the periphery of the k-space and has a decreasing value as it goes closer to the periphery, and Fourier-transformation processing means for conducting Fourier-transformation processing on the window-processed MR signals to produce an MR image.

The window processing is conducted to concentrically suppress a high frequency portion of MR signals to thereby prevent truncation artifacts or anisotropic noise texture due to signal acquisition confined to a limited rectangular region in a k-space by the MRI apparatus.

Related conventional techniques are disclosed in Japanese Patent Application Laid Open Nos. H4-53531 and H6-121781.

In the conventional MRI apparatus, the same window processing is conducted whether the image to be produced is a blood flow image or not.

In other words, the conventional window processing is not optimal when the image to be produced is a blood flow image, and it cannot improve rendering capability for a blood vessel.

SUMMARY OF THE INVENTION

It is therefore an object of the present invention to provide an MR image producing method and MRI apparatus that improve on rendering capability for a blood vessel by optimizing window processing when an image to be produced is a blood flow image.

In a first aspect, the present invention provides an MR image producing method characterized in comprising: window-processing MR signals using a window function that has a value less than one at a center and in its proximate region in a k-space and on a periphery and in its proximate region in the k-space, and, between the regions in which the window function has a value less than one, has a value larger than that in the regions in which the window function has a value less than one; and applying Fourier-transformation processing to the window-processed MR signals to obtain an MR image.

In this configuration, the proximate region of the center of the k-space is a range of about five—twenty data points from the center of the k-space. The proximate region of the periphery of the k-space is a range of about five—twenty data points from the periphery of the k-space.

According to the MR image producing method of the first aspect, since a window function that has a value less than one at a center and in its proximate region in the k-space is employed, MR signals near the center of the k-space are suppressed. MR signals of a tissue portion are narrowly distributed near the center of the k-space, while MR signals of a blood flow portion are broadly distributed in a high frequency region, as well as near the center. Thus, the MR signals of the tissue portion are strongly suppressed, while the MR signals of the blood flow portion are relatively weakly suppressed. Therefore, rendering capability for a blood vessel is relatively improved.

Moreover, since the window function has a value less than one on a periphery and in its proximate region in the k-space, a high frequency portion of MR signals can be concentrically suppressed as in the conventional technique.

In a second aspect, the present invention provides an MR image producing method characterized in comprising: window-processing MR signals using a window function that has a value less than one at a center of a k-space, first increases to a value C equal to or more than one as it goes farther from the center, remains at C for a certain duration, then passes to one, and decreases to a value less than one as it goes from near a periphery to the periphery of the k-space; and applying Fourier-transformation processing to the window-processed MR signals to obtain an MR image.

In this configuration, the region in which the window function has a value increasing to a value C from the center of the k-space is a range of about three—fifteen data points from the center of the k-space. The region in which the window function remains at C for a certain duration is a range of about twenty—fifty data points. The region in which the window function passes from C to one is a range of about three—ten data points. The region in which the window function has a value less than one is a range of about five—twenty data points from the periphery of the k-space.

According to the MR image producing method of the second aspect, since the window function has a value less than one at a center and in its proximate region in the k-space, MR signals near the center of the k-space are suppressed. MR signals of a tissue portion are narrowly distributed near the center of the k-space, while MR signals of a blood flow portion are broadly distributed in a high frequency region, as well as near the center. Thus, the MR signals of the tissue portion are strongly suppressed, while the MR signals of the blood flow portion are relatively weakly suppressed. Next, in the region in which "the window function remains at C for a certain duration", a zero-th order peak portion (a crest having a maximum value at the center) in the MR signals of the blood flow portion is preserved or amplified. Next, in the region in which "the window function passes to one", a first- or higher order peak portion (a crest having a maximum value at a position except the center) in the MR signals of the blood flow portion is preserved. Thus, rendering capability for a blood vessel is relatively improved.

Moreover, since the window function has a value less than one on a periphery and in its proximate region in the k-space, a high frequency portion of MR signals can be concentrically suppressed as in the conventional technique.

In a third aspect, the present invention provides the MR image producing method having the aforementioned configuration, characterized in that: the window function is a function using a Gaussian function in the region in which the window function increases to C.

According to the MR image producing method of the third aspect, a Gaussian function $\exp\{-|k|^2/a^2\}$ can be used to smoothly increase the value from a value less than one to a value C.

In a fourth aspect, the present invention provides the MR image producing method having the aforementioned configuration, characterized in that: the window function is a function using a Fermi-Dirac function in the region in which the window function decreases to a value less than one.

According to the MR image producing method of the fourth aspect, a Fermi-Dirac function $1/(1+\exp\{(|k|-R)/b\})$ can be used to smoothly reduce the value from one to a value less than one.

In a fifth aspect, the present invention provides an MR image producing method characterized in comprising: window-processing MR signals using a window function that has a value less than one at a center of a k-space, first increases to one as it goes farther from the center, remains at one for a certain duration, and decreases to a value less than one as it goes from near a periphery to the periphery of the k-space; and applying Fourier-transformation processing to the window-processed MR signals to obtain an MR image.

According to the MR image producing method of the fifth aspect, since the window function has a value less than one at a center and in its proximate region in the k-space, MR signals near the center of the k-space are suppressed. MR signals of a tissue portion are narrowly distributed near the center of the k-space, while MR signals of a blood flow portion are broadly distributed in a high frequency region, as well as near the center. Thus, the MR signals of the tissue portion are strongly suppressed, while the MR signals of the blood flow portion are relatively weakly suppressed. Next, in the region in which "the window function remains at one for a certain duration," MR signals of the blood flow portion are preserved. Thus, rendering capability for a blood vessel is relatively improved.

Moreover, since the window function has a value less than one on a periphery and in its proximate region in the k-space, a high frequency portion of MR signals can be concentrically suppressed as in the conventional technique.

In a sixth aspect, the present invention provides the MR image producing method having the aforementioned configuration, characterized in that: the window function is a function using a Gaussian function in the region in which the window function increases to one.

According to the MR image producing method of the sixth aspect, a Gaussian function $\exp\{-|k|^2/a^2\}$ can be used to smoothly increase the value from a value less than one to one.

In a seventh aspect, the present invention provides the MR image producing method having the aforementioned configuration, characterized in that: the window function is a function using a Fermi-Dirac function in the region in which the window function decreases to a value less than one.

According to the MR image producing method of the seventh aspect, a Fermi-Dirac function $1/(1+\exp\{(|k|-R)/b\})$ can be used to smoothly reduce the value from one to a value less than one.

In an eighth aspect, the present invention provides an MR image producing method characterized in comprising: producing MR images by the MR image producing method having the aforementioned configuration for a plurality of sequential slices; generating three-dimensional data from the MR images; and conducting MIP processing on the three-dimensional data to produce a projection image.

In the MR image producing method of the eighth aspect, rendering capability for a blood vessel can be improved for an angiographic image.

In a ninth aspect, the present invention provides an MRI apparatus characterized in comprising: MR signal acquiring means for acquiring MR signals; window-processing means for window-processing the MR signals using a window function that has a value less than one at a center and in its proximate region in a k-space and on a periphery and in its proximate region in the k-space, and, between the regions in which the window function has a value less than one, has a value larger than that in the regions in which the window function has a value less than one; and Fourier-transformation processing means for applying Fourier-transformation processing to the window-processed MR signals to obtain an MR image.

According to the MRI apparatus of the ninth aspect, the MR image producing method of the first aspect can be suitably implemented.

In a tenth aspect, the present invention provides an MRI apparatus characterized in comprising: MR signal acquiring means for acquiring MR signals; window-processing means for window-processing the MR signals using a window function that has a value less than one at a center of a k-space, first increases to a value C equal to or more than one as it goes farther from the center, remains at C for a certain duration, then passes to one, and decreases to a value less than one as it goes from near a periphery to the periphery of the k-space; and Fourier-transformation processing means for applying Fourier-transformation processing to the window-processed MR signals to obtain an MR image.

According to the MRI apparatus of the tenth aspect, the MR image producing method of the second aspect can be suitably implemented.

In an eleventh aspect, the present invention provides the MRI apparatus having the aforementioned configuration, characterized in that: the window function is a function using a Gaussian function in the region in which the window function increases to C.

According to the MRI apparatus of the eleventh aspect, the MR image producing method of the third aspect can be suitably implemented.

In a twelfth aspect, the present invention provides the MRI apparatus having the aforementioned configuration, characterized in that: the window function is a function using a Fermi-Dirac function in the region in which the window function decreases to a value less than one.

According to the MRI apparatus of the twelfth aspect, the MR image producing method of the fourth aspect can be suitably implemented.

In a thirteenth aspect, the present invention provides an MRI apparatus characterized in comprising: MR signal acquiring means for acquiring MR signals; window-processing means for window-processing the MR signals using a window function that has a value less than one at a center of a k-space, first increases to one as it goes farther from the center, remains at one for a certain duration, and decreases to a value less than one as it goes from near a periphery to the periphery of the k-space; and Fourier-transformation processing means for applying Fourier-transformation processing to the window-processed MR signals to obtain an MR image.

According to the MRI apparatus of the thirteenth aspect, the MR image producing method of the fifth aspect can be suitably implemented.

In a fourteenth aspect, the present invention provides the MRI apparatus having the aforementioned configuration, characterized in that: the window function is a function using a Gaussian function in the region in which the window function increases to one.

According to the MRI apparatus of the fourteenth aspect, the MR image producing method of the sixth aspect can be suitably implemented.

In a fifteenth aspect, the present invention provides the MRI apparatus having the aforementioned configuration, characterized in that: the window function is a function using a Fermi-Dirac function in the region in which the window function decreases to a value less than one.

According to the MRI apparatus of the fifteenth aspect, the MR image producing method of the seventh aspect can be suitably implemented.

In a sixteenth aspect, the present invention provides the MRI apparatus characterized in comprising: three-dimensional data generating means for generating three-dimensional data from MR images produced for a plurality of sequential slices; and MIP-processing means for conducting MIP processing on the three-dimensional data to produce a projection image.

According to the MRI apparatus of the sixteenth aspect, the MR image producing method of the eighth aspect can be suitably implemented.

According to the MR image producing method and MRI apparatus of the present invention, rendering capability for a blood vessel is improved. Moreover, noise in a high frequency region is suppressed to improve CNR (carrier to noise ratio).

Further objects and advantages of the present invention will be apparent from the following description of the preferred embodiments of the invention as illustrated in the accompanying drawings.

BRIEF DESCRIPTION OF THE DRAWINGS

FIG. 9 is a flow chart showing three-dimensional MR image processing in accordance with a third embodiment.

DETAILED DESCRIPTION OF THE INVENTION

The present invention will now be described in more detail with reference to embodiments shown in the accompanying drawings.

First Embodiment

Figure 1:
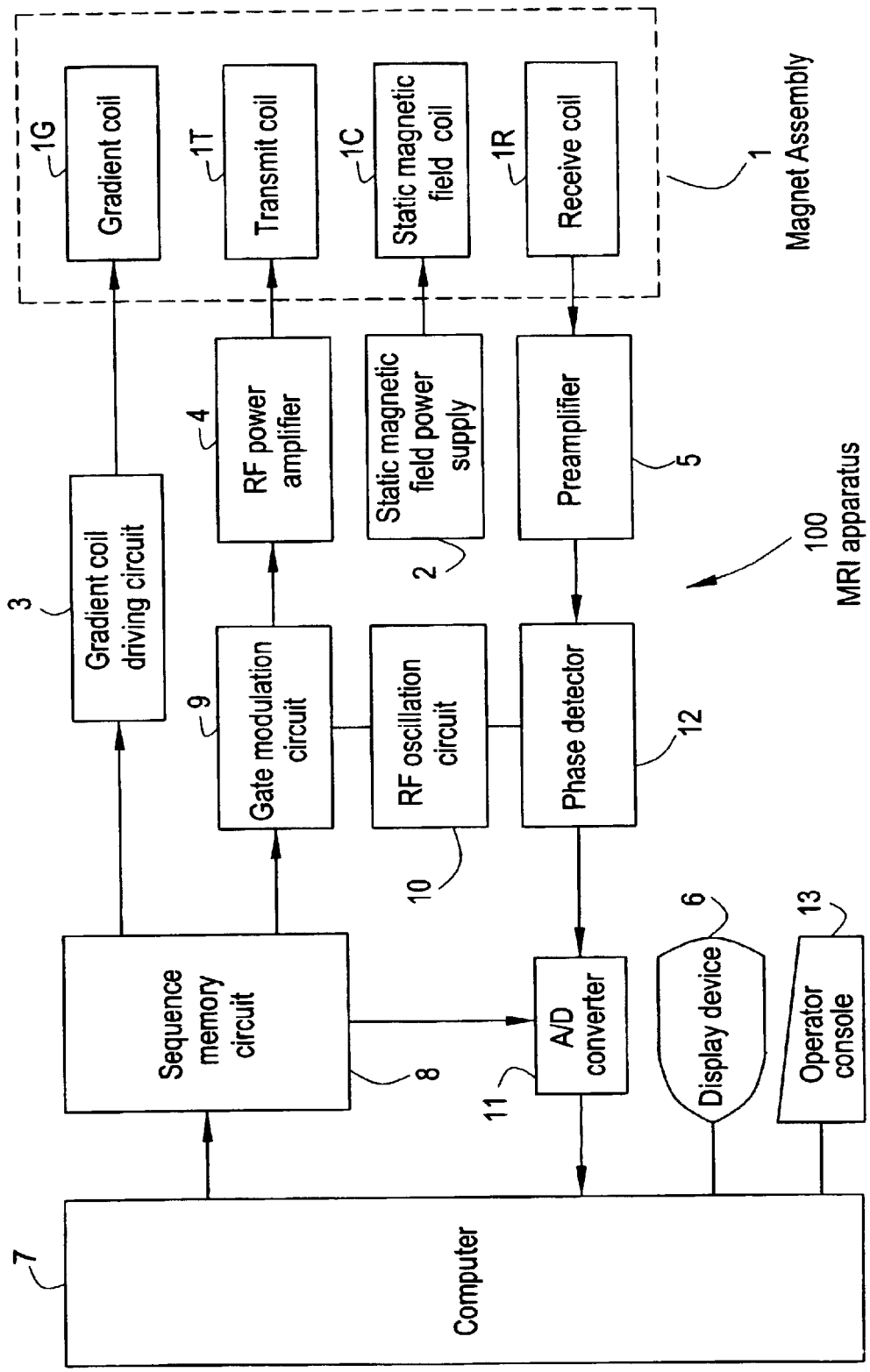
FIG. 1 is a block diagram showing an MRI apparatus in accordance with a first embodiment.

FIG. 1 is a block diagram showing an MRI apparatus in accordance with a first embodiment.

In the MRI apparatus 100, a magnet assembly 1 has a bore (cavity portion) for inserting therein a subject, and is provided, surrounding the bore, with a gradient coil (which comprises X-axis, Y-axis and Z-axis coils, and the combination thereof determines slice, warp and read axes) 1G for generating gradient magnetic fields, a transmit coil 1T for applying RF pulses for exciting spins of atomic nuclei within the subject, a receive coil 1R for detecting NMR signals from the subject, and a static magnetic field power supply 2 and static magnetic field coil 1C for generating a static magnetic field.

It should be noted that permanent magnets may be employed in place of the static magnetic field power supply 2 and static magnetic field coil 1C (superconductive coil).

The gradient coil 1G is connected to a gradient coil driving circuit 3. The transmit coil 1T is connected to an RF power amplifier 4. The receive coil 1R is connected to a preamplifier 5.

A sequence memory circuit 8 operates the gradient coil driving circuit 3 based on a stored pulse sequence in response to instructions from a computer 7 to thereby generate gradient magnetic fields from the gradient coil 1G. The sequence memory circuit 8 also operates a gate modulation circuit 9 to modulate high frequency output signals from an RF oscillation circuit 10 into pulsed signals of predefined timing and envelope. The pulsed signals are applied to the RF power amplifier 4 as excitation pulses, power-amplified in the RF power amplifier 4, and then applied to the transmit coil 1T in the magnet assembly 1 to transmit RF pulses.

The preamplifier 5 amplifies NMR signals from the subject detected at the receive coil 1R in the magnet assembly 1, and inputs the signals to a phase detector 12. The phase detector 12 phase-detects the NMR signals from the preamplifier 5 employing the output from the RF oscillation circuit 10 as a reference signal, and supplies the phase-detected signals to an A/D converter 11. The A/D converter 11 converts the phase-detected analog signals into MR data in the form of digital signals, and inputs them to the computer 7.

The computer 7 reads the MR data from the A/D converter 11, and performs image reconstruction processing to produce an MR image. The computer 7 is also responsible for overall control such as receiving information supplied from an operator console 13.

A display device 6 displays the MR image.

Figure 2:
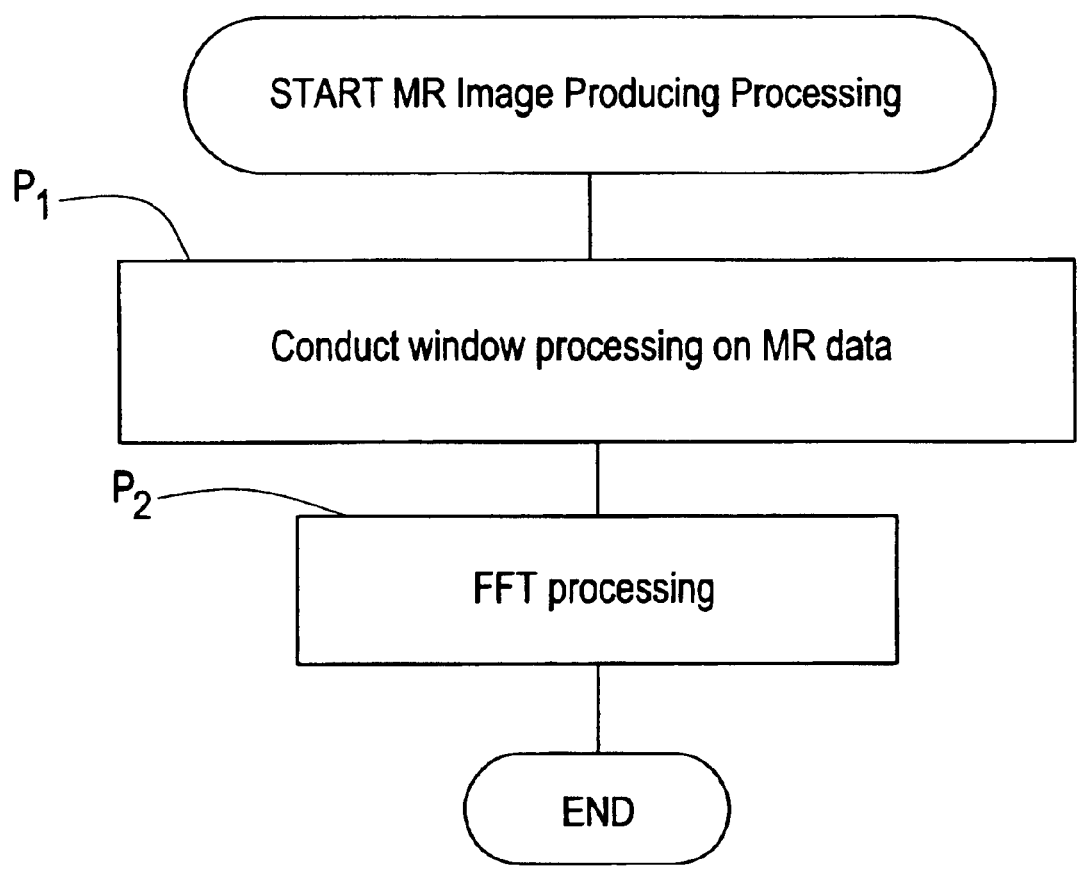
FIG. 2 is a flow chart showing MR image producing processing in accordance with the first embodiment.

FIG. 2 is a flow chart showing MR image producing processing by the MRI apparatus 100.

At Step P1, window processing is applied to MR data collected from one slice.

Figure 3:
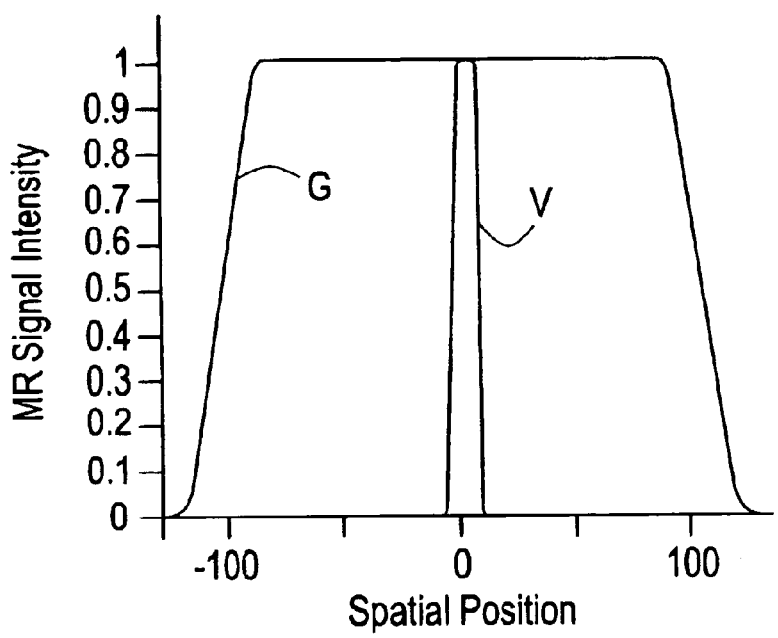
FIG. 3 is a graph showing the MR signal intensity on a center axis of a slice in an assumed model.

At that time, a model for the slice is assumed such that a circular blood vessel lies in the center of a 256×256 FOV (field of view) and brain matters surround the blood vessel in a donut-like shape. Moreover, for the MR signal intensity on a slice center axis, the model is assumed to have the maximum signal intensity of the brain matters G and that of the blood vessel V equal to each other, as shown in FIG. 3. The horizontal axis in FIG. 3 represents the index of a pixel point.

The MR signal intensity over a whole slice plane is a curved surface formed by axially rotating the curve of FIG. 3 around an axis of rotation at a position O in FIG. 3.

Figure 4:
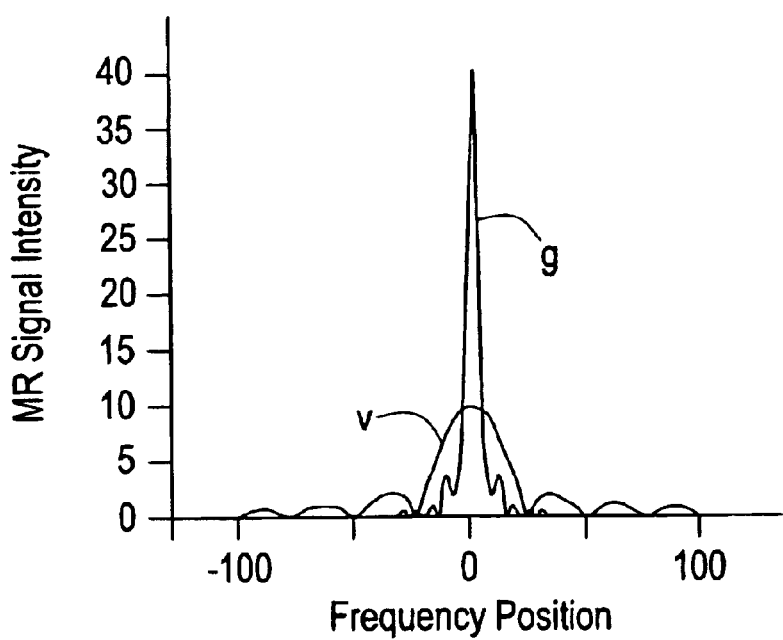
FIG. 4 is a graph showing the MR signal intensity on a center axis of a k-space in the assumed model.

For this model, a distribution of frequency components of MR signals on the center axis of the k-space is shown in FIG. 4. The horizontal axis in FIG. 4 represents the index of a data point in the k-space. From the viewpoint of frequency, a position O on the horizontal axis corresponds to a direct-current position (the center of the k-space), and the frequency becomes higher as it approaches the periphery.

As shown in FIG. 4, the frequency component g of the brain matters G contained in the MR data has a very strong peak at the center, and is narrowly distributed near the center. On the other hand, the frequency component v of the blood vessel V (the frequency component of blood flow) contained in the MR data has a relatively weak peak at the center, and is broadly distributed in a high frequency region, as well as near the center.

The distribution of frequency components of MR signals over a whole k-space is a curved surface formed by axially rotating the curve of FIG. 4 around an axis of rotation at the center in FIG. 4.

Figure 5:
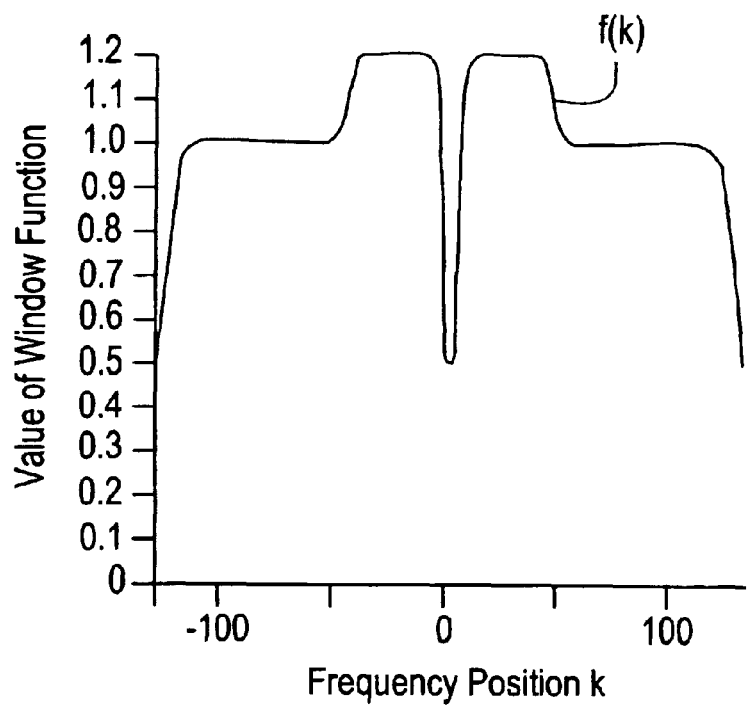
FIG. 5 is a graph showing a value of a window function on a center axis of the k-space in accordance with the first embodiment.

FIG. 5 shows a window function f(k) employed for MR signals on the center axis of the k-space.

The window function f(k) has a value 0.5 at the center of the k-space, first increases to a value 1.2 as it goes farther from the center, remains at the value 1.2 for a certain duration, then passes to one, and decreases to a value 0.5 as it goes from near a periphery to the periphery of the k-space.

In the region in which the value increases from 0.5 to 1.2, the window function f(k) is represented by:

$$f(k)=C(1-A\cdot\exp\{-|k|^2/a^2\}),$$

where $\alpha$, A and C are constants, and k is the distance from the center. In FIG. 5, C=1.2, A=0.6, and $\alpha$=5.

In the region in which the value decreases from one to 0.5, the window function f(k) is represented by:

$$f(k)=1/(1+\exp\{(|k|-R)/b\}),$$

where b and R are constants, and k is the distance from the center. In FIG. 5, R=128, and b=3.

The window function f(k) over a whole k-space is a curved surface formed by axially rotating the curve of FIG. 5 around an axis of rotation at the center in FIG. 5.

Figure 6:
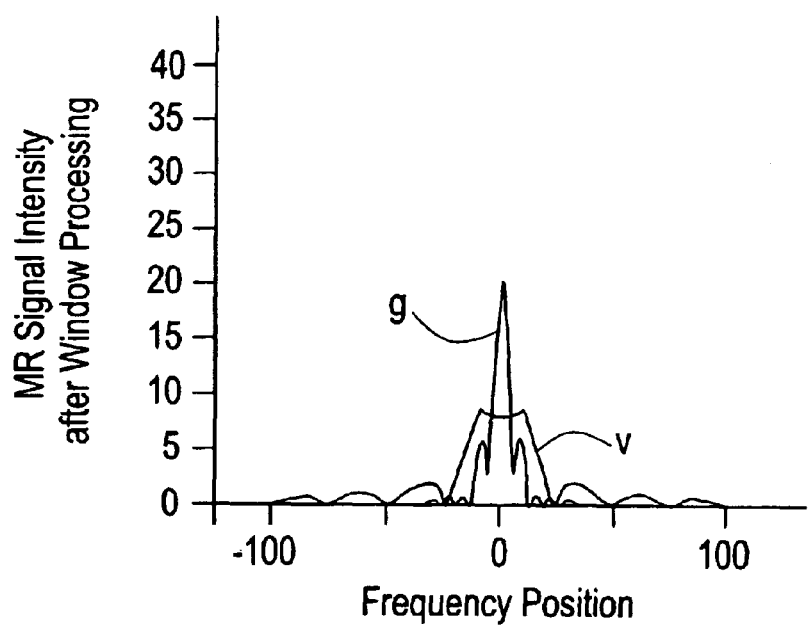
FIG. 6 is a graph showing the MR signal intensity on a center axis of the k-space after window processing in accordance with the first embodiment.

FIG. 6 shows a distribution of frequency components in the window-processed MR signals on a center axis of the k-space.

The frequency component g of the brain matters G is strongly suppressed to about a half of the original intensity.

On the other hand, a zero-th order peak portion of the frequency component v of the blood vessel is suppressed at the center, while it is amplified near the center. A first- and higher order peak portions are preserved at the original intensity.

The frequency components of MR signals over a whole k-space are a curved surface formed by axially rotating the curve of FIG. 6 around an axis of rotation at the center in FIG. 6.

Returning to FIG. 2, at Step P2, the window-processed MR data is processed by two-dimensional FFT (fast Fourier transformation).

Figure 7:
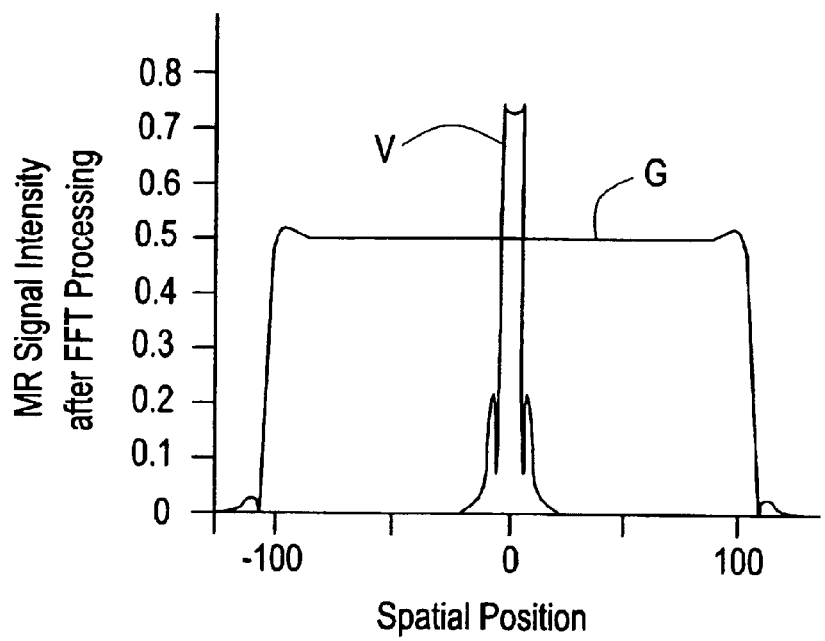
FIG. 7 is a graph showing the MR signal intensity on a center axis of a slice after FFT processing in accordance with the first embodiment.

FIG. 7 shows the MR signal intensity on the center axis of a slice after the FFT processing.

The signal of the brain matters G is strongly suppressed, while the signal of the blood vessel V remains near the original intensity.

The MR signal intensity over a whole slice is a curved surface formed by axially rotating the curve of FIG. 7 around an axis of rotation at a position O in FIG. 7.

As a result, the rendering capability for the blood vessel V can be relatively improved.

Moreover, the window function f(k) has a value less than one on the periphery and in its proximate region in the k-space. Thus, a high frequency portion of MR signals can be concentrically suppressed as in the conventional technique.

Second Embodiment

Figure 8:
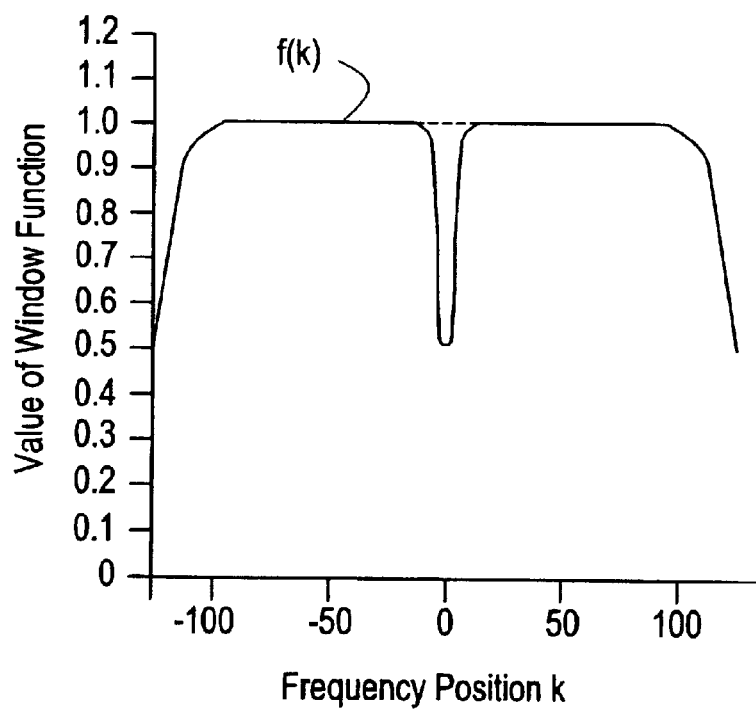
FIG. 8 is a graph showing a value of a window function on a center axis of a k-space in accordance with a second embodiment.

In a second embodiment, a window function as shown in FIG. 8 is used to achieve window processing.

The window function f(k) in FIG. 8 has a value 0.5 at the center of the k-space, increases to a value one as it goes farther from the center, remains at the value one for a certain duration, and decreases to a value 0.5 as it goes from near the periphery of the k-space to the periphery.

In the region in which the value increases from 0.5 to one, the window function f(k) is represented by:

$$f(k)=1-A\cdot\exp\{-|k|^2/a^2\},$$

where $\alpha$ and A are constants, and k is the distance from the center.

In the region in which the value decreases from one to 0.5, the window function f(k) is represented by:

$$f(k)=1/(1+\exp\{(|k|-R)/b\}),$$

where b and R are constants, and k is a distance from the center.

The window function f(k) over a whole k-space is a curved surface formed by axially rotating the curve of FIG. 8 around an axis of rotation at the center in FIG. 8.

It should be noted that the window function would be identical to the conventional one when it has a value of one at the center and in its proximate region, as indicated by broken line in FIG. 8.

Third Embodiment

In a third embodiment, a three-dimensional MR image is produced with improved rendering capability for the blood vessel V.

FIG. 9 is a flow chart showing three-dimensional MR image producing processing in accordance with the third embodiment.

At Step Q1, an MR image is produced according to one of the aforementioned embodiments, and the production is repeated for a plurality of slices sequentially lining up in a thickness direction.

At Step Q2, three-dimensional data is generated from the MR images of the plurality of slices sequentially lining up in the thickness direction.

At Step Q3, MIP (maximum intensity projection) processing is conducted on the three-dimensional data to produce a three-dimensional MR image.

Since the MR images of the slices are those with improved rendering capability for the blood vessel V, the three-dimensional MR image is also an MR image with improved rendering capability for the blood vessel V, and the present embodiment is suitable for producing an angiographic image.

Other Embodiments

The window function may be generated from a combination of functions other than the aforementioned functions for use in the window processing.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:
an MR signal acquiring device for acquiring MR signals;
a window-processing device for window-processing the MR signals using a window function that has a value less than one at a center and in its proximate region in a k-space and on a periphery and in its proximate region in the k-space, and, between the regions in which the window function has a value less than one, has a value larger than that in the regions in which the window function has a value less than one; and
a Fourier-transformation processing device for applying Fourier-transformation processing to the window-processed MR signals to obtain an MR image.

2. The MRI apparatus of claim 1 further comprising:
a three-dimensional data generating device for generating three-dimensional data from MR images produced for a plurality of sequential slices; and
a MIP-processing device for conducting MIP processing on the three-dimensional data to produce a projection image.

3. An MRI apparatus comprising:
an MR signal acquiring device for acquiring MR signals;
a window-processing device for window-processing the MR signals using a window function that has a value less than one at a center of a k-space, first increases to a value C equal to or more than one as it goes farther from the center, remains at C for a certain duration, then passes to one, and decreases to a value less than one as it goes from near a periphery to the periphery of the k-space; and
a Fourier-transformation processing device for applying Fourier-transformation processing to the window-processed MR signals to obtain an MR image.

4. The MRI apparatus of claim 3, wherein the window function is a function using a Gaussian function in the region in which the window function increases to C.

5. The MRI apparatus of claim 3, wherein the window function is a function using a Fermi-Dirac function in the region in which the window function decreases to a value less than one.

6. The MRI apparatus of claim 3 further comprising:
a three-dimensional data generating device for generating three-dimensional data from MR images produced for a plurality of sequential slices; and
a MIP-processing device for conducting MIP processing on the three-dimensional data to produce a projection image.

7. An MRI apparatus comprising:
an MR signal acquiring device for acquiring MR signals;
a window-processing device for window-processing the MR signals using a window function that has a value less than one at a center of a k-space, first increases to one as it goes farther from the center, remains at one for a certain duration, and decreases to a value less than one as it goes from near a periphery to the periphery of the k-space; and
a Fourier-transformation processing device for applying Fourier-transformation processing to the window-processed MR signals to obtain an MR image.

8. The MRI apparatus of claim 7, wherein the window function is a function using a Gaussian function in the region in which the window function increases to one.

9. The MRI apparatus of claim 7, wherein the window function is a function using a Fermi-Dirac function in the region in which the window function decreases to a value less than one.

10. The MRI apparatus of claim 7 further comprising:
a three-dimensional data generating device for generating three-dimensional data from MR images produced for a plurality of sequential slices; and
a MIP-processing device for conducting MIP processing on the three-dimensional data to produce a projection image.

* * * * *